United States Patent [19]

Ochs

[11] 3,800,241

[45] Mar. 26, 1974

[54] VOLTAGE PEAK SAMPLED AMPLITUDE CONTROLLED PHASE SHIFT OSCILLATOR

[75] Inventor: Eugene V. Ochs, Everett, Wash.

[73] Assignee: John Fluke Mfg. Co., Inc., Seattle, Wash.

[22] Filed: Sept. 20, 1972

[21] Appl. No.: 290,529

[52] U.S. Cl. .......................... 331/45, 331/25, 331/34, 331/135, 331/183

[51] Int. Cl. .......................... H03b 3/02, H03b 5/20

[58] Field of Search ........... 331/18, 25, 34, 45, 135, 331/136, 182, 183

[56] References Cited

UNITED STATES PATENTS

| | | | |
|---|---|---|---|
| 3,024,426 | 3/1962 | Davies | 331/135 |
| 3,137,825 | 6/1964 | Haner | 331/135 X |

*Primary Examiner*—Herman Karl Saalbach
*Assistant Examiner*—Siegfried H. Grimm
*Attorney, Agent, or Firm*—Christensen, O'Connor, Garrison & Havelka

[57] ABSTRACT

An amplitude controlled oscillator which is capable of generating a wide range of stable frequencies having a variable amplitude which may be accurately controlled. A series of amplifiers are connected so as to provide a standard feedback oscillator, the phase shift around the loop being 360° and the loop gain close to unity. The zero crossing of the oscillator output signal in the negative direction is first detected, which enables a gate by which the positive going peaks of the oscillator signal are sampled for a predetermined fixed period of time. This sampled voltage is then compared with a fixed DC reference voltage and any difference is used to increment an integrator, the output of which is fed back to the oscillator, ultimately stabilizing the oscillator amplitude at the value of the reference voltage.

9 Claims, 2 Drawing Figures

VOLTAGE PEAK SAMPLED AMPLITUDE CONTROLLED PHASE SHIFT OSCILLATOR

BACKGROUND OF THE INVENTION

The present invention relates broadly to the feedback oscillator art, and more specifically to that art which is concerned with feedback oscillators having internal amplitude control.

It is important for variable frequency oscillators to give a stable output over a wide range of frequencies and amplitudes. A typical approach by the prior art to accomplish this stable output is to utilize an oscillator having a variable frequency capability but having a fixed, relatively large, amplitude. An attenuator, typically a potentiometer, is affixed to the output of the oscillator so that the operator may control the amplitude of the oscillator. In this approach, the variable amplitude of the output is accomplished by a means external to the oscillator circuitry, rather than through an integral part of the oscillator itself. This approach has several disadvantages, because a potentiometer is not an extremely precise device over an extended range of frequencies. Thus, its characteristics may vary within the frequency range covered by the oscillator, which would result in amplitude inaccuracies. Furthermore, a potentiometer is an analog device, and therefore does not have the discreet capability of a digital device. Thus, although the analog potentiometer may be varied throughout an entire amplitude range, the operator can never be certain of the instrument's exact amplitude within that range. The use of digital circuitry, of course, would allow the operator to reliably select discreet voltage amplitudes.

Additionally, prior art which does utilize internal amplitude control, such as U.S. Pat. No. 3,382,461 to Wolcot and U.S. Pat. No. 3,024,426 to Davies still has the basic problem of maintaining stable oscillator performance over an extended range of frequencies and amplitudes. Furthermore, the amplitude range of such oscillators is severely limited.

In view of the above, an object of the present invention is to provide an oscillator having internal amplitude control over a wide range of output frequencies.

It is another object of the present invention to provide an oscillator wherein the amplitude of the output is internally controlled by digital, rather than analog, circuitry.

It is a further object of this invention to provide an oscillator wherein the impact of the amplitude control voltage increases with the output frequency of the oscillator.

It is a further object of the present invention to provide an oscillator wherein the amplitude correction increases in speed as the output frequency of the oscillator increases.

It is a still further object of the present invention to provide an oscillator having an internal amplitude control which may be varied by the operator.

SUMMARY OF THE INVENTION

Briefly, in accordance with a preferred embodiment, the present invention includes a feedback oscillator, having a separate amplitude control feedback loop. The signal is sampled at a point within the oscillator circuitry for a specified time each cycle, and this value is compared with a reference voltage, the difference being fed back to the input of the oscillator, the amplitude of the oscillator output stabilizing at the value of the reference voltage.

DESCRIPTION OF THE PREFERRED EMBODIMENT

Figure 1:
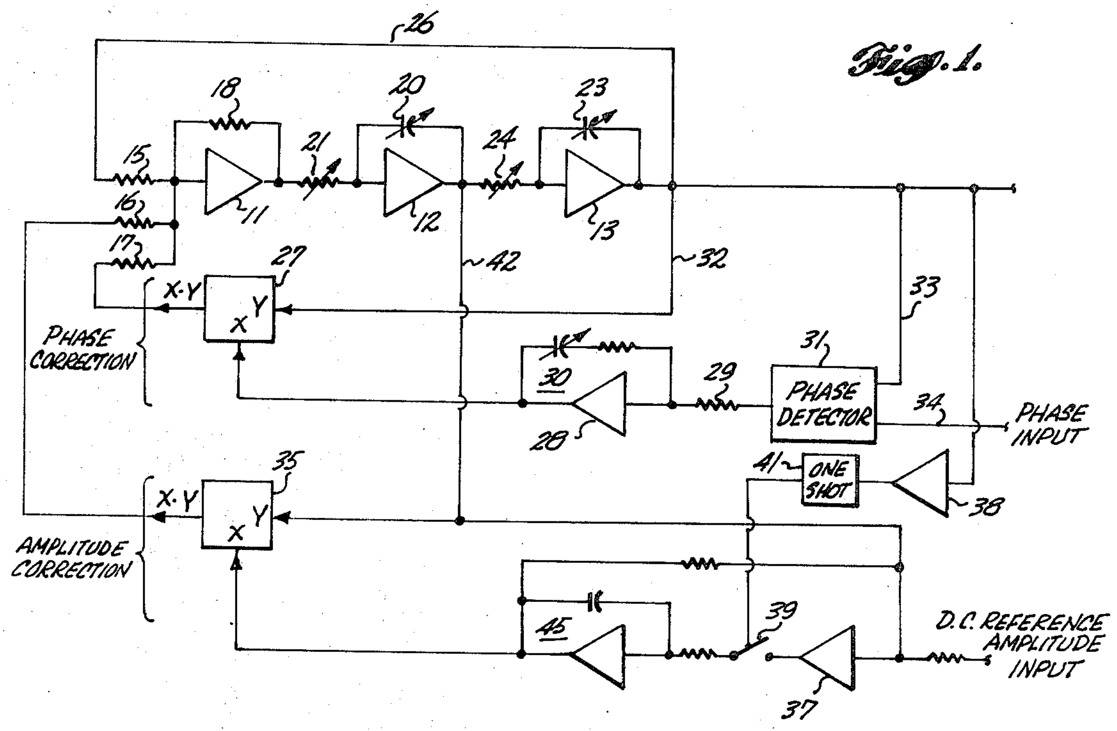
FIG. 1 is a diagram of the oscillator and its associated control circuitry.

Referring to FIG. 1, a standard feedback oscillator is shown with accompanying feedback loops for both phase correction and amplitude correction of the oscillator output. The oscillator consists of identical amplifiers 11, 12 and 13. Amplifier 11 is a summing amplifier having three inputs through resistors 15, 16 and 17. Resistors 15 and 18 are equal in magnitude so as to give a 180° phase shift or phase inversion between the input and output of amplifier 11. Amplifier 12 with its associated feedback capacitor 20 and input resistor 21, both of which are variable, form a first integrator which integrates the output of amplifier 11. This first integrator has a phase shift of approximately 90° from input to output. Amplifier 13, in conjunction with capacitor 23 and resistor 24 both of which are variable, form a second integrator, which introduces an additional phase shift from input to output of approximately 90°. The total phase shift of the two integrators will then equal 180°, and combined with the phase inversion of amplifier 11, the phase shift around the entire loop will be 360°, which is one prerequisite for oscillation.

Since resistor 15 is equal to resistor 18, the gain around the entire loop, that is, the product of the gain of the oscillator amplifier and the feedback factor of the feedback loop, will be determined by the values of resistances 21 and 24, and capacitances 20 and 23. Because of these two RC networks, the gain around the loop is falling with frequency at approximately 12 dB per octave. Thus, when the loop gain referred to above reaches unity, the loop will oscillate at that frequency.

The frequency at which unity gain is achieved, and hence loop oscillation, is determined also by the values of the variable resistances and capacitances. The variable resistances 21 and 24 are used to make the fine adjustments of frequency control within a decade frequency range. The variable capacitances 20 and 23 are used to change the decade frequency range of the oscillator.

In addition to the primary oscillator feedback path on line 26, two additional feedback paths are provided, for control of the phase of the oscillator, and hence its frequency of oscillation, and for control of the amplitude of the oscillations. Although the amplitude is of special significance in the present application, both the operation of the phase loop and the amplitude loop will be described, so as to give a thorough and comprehensive understanding of the operation of the oscillator of the present invention.

The phase loop consists of the multiplier 27, the integrator formed by amplifier 28, the resistor 29 and the capacitor 30, and the phase detector 31. The output of the oscillator is applied directly to the Y input of the multiplier 27 via line 32. The output is also applied to the phase detector 31 on line 33, which compares the phase of the oscillator output with a reference phase applied on line 34. Any phase error is thus amplified and applied to the oscillator input through multiplier 27 and resistance 17. By varying the feedback through the phase loop, the gain of the loop may be changed. As a result of changing the gain around the phase loop, the frequency of oscillation may be controlled or corrected to a certain extent. As was stated above, the frequency of oscillation of the loop is basically determined by the values of resistance 21 and 24 and capacitances 20 and 23. At a particular set of these values, there will be a resulting associated oscillator frequency wherein the phase shift around the entire loop is zero. However, to accomplish oscillation at that frequency, the product of the gain of the amplifier and the feedback factor $E_{feedback}/E_{out}$ must be at least unity. Since the gain of the amplifier is likewise a function of the values of resistances 21 and 23, and capacitances 20 and 23, the feedback factor may be varied to provide slight corrections in the frequency of oscillation.

Another feedback loop is provided to make corrections and adjustments in the amplitude of the oscillator output. The output of the amplifier 12 is applied directly to the Y input of multiplier 35, and also as an input to the amplifier 37, along with a DC reference voltage. This reference voltage is selected by the operator as the desired amplitude of the oscillator and is added algebraically with the amplitude signal value from the output of amplifier 12. This feedback loop is controlled by a zero crossing detector 38 and a switch 39. The zero crossing detector 38 and a standard monostable multivibrator 41 in series with the zero crossing detector determines when the output of amplifier 13, and hence, the oscillator output, is crossing the zero reference line in a negative direction. This crossing of the zero line in the negative direction by the oscillator output voltage activates the one shot 41, which subsequently closes the switch 39 for a predetermined time.

Since the switch 39 is closed at a time when the output of the oscillator is crossing zero in a negative direction, the voltage from amplifier 12 on line 42 applied to amplifier 37 for comparison with the reference voltage will lag the oscillator output by 90°, and hence will be at a peak positive amplitude. Because there is a 90° phase shift between the output of amplifiers 12 and 13, as explained above, the output of the amplifier 12 will be reaching a peak positive value when the output of amplifier 13, and hence the oscillator output, is crossing zero in a negative direction.

Thus, the switch 39 is closed during a predetermined time for each oscillator cycle, during which time the peak amplitude of the output of amplifier 12 is compared with the DC reference. If during this specified time, an amplitude difference between the output of amplifier 12 and the DC reference voltage is detected, an appropriate difference error signal is sent to the integrator 45. It should be emphasized that the switch 39 is closed at a specified time and for a predetermined time during each cycle of oscillator output. Likewise, the error signal output from amplifier 37 will be present, if at all, during the time of switch closing.

The output of the integrator 45 is then applied to the X input of multiplier 35, the output of which is applied to the summing amplifier 11 through resistor 16, completing the amplitude control loop.

This loop in essence introduces a feedback signal component to the input of the oscillator which is in quadrature with the phase of the oscillator, but shifted either 90° or 270°. This component results in the total phase shift of the two integrators of amplifiers 12 and 13 in the oscillator being slightly greater than or slightly less than 180°. If the amplifier 12 peak output is less than the reference voltage, the phase shift will be greater than 180°. For a phase shift greater than 180°, the oscillator output amplitude will increase, and will continue to increase until the feedback decreases to zero, indicating that the peak amplitude output of amplifier 12 is equal to the reference voltage.

If, however, the amplifier 12 peak output is greater than the DC reference voltage, signal components introduced into the feedback path will result in a phase shift of less than 180°. For this condition, the oscillator output will decrease, until the peak output of amplifier 12 is equal to the DC reference voltage.

Figure 2:
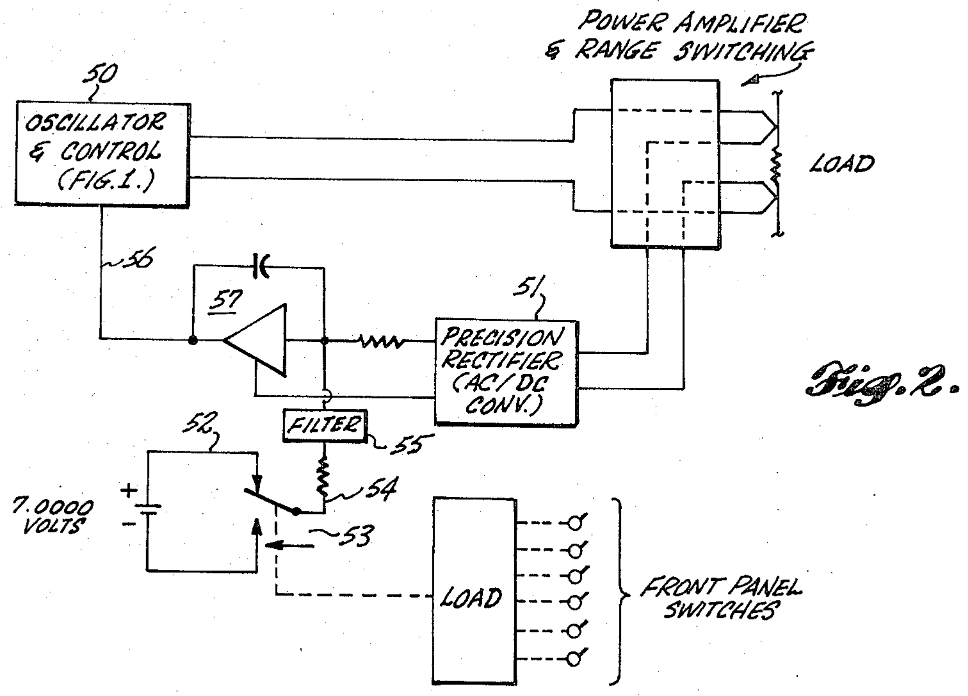
FIG. 2 is a diagram of the overall control loop, a part of which is the oscillator shown in FIG. 1.

In actual operation, the accuracy of such an amplitude control loop is frequently imprecise, having an error on the order of several percent. To increase the accuracy of the amplitude control loop, the oscillator and its control circuitry shown in FIG. 1 can be implemented in conjunction with other control circuitry shown in FIG. 2. The oscillator control circuitry shown in FIG. 1 is shown as block 50 in FIG. 2. The AC signal that appears across the load from the output of the oscillator is converted by a standard AC/DC converter 51 into a DC voltage within an accuracy of ±0.02 percent. This DC is then compared to a precision DC voltage source 52. This precision DC is generated by a fixed 7.0000 volt source connected to a standard FET switch. This switch 53 is turned on and off with a duty cycle proportional to the desired output. The resulting signal on line 54 is a pulse train having a duty cycle, and hence, a DC voltage average which is proportional to the output. The duty cycle of the FET switch is controlled by standard digital logic associated with integrated circuit counters. The DC pulse train is then applied to a three pole active filter 55 in which all the AC components of the signal are removed. This DC standard is then compared in comparator 57 with the output of the AC/DC converter, and the output of the comparator is applied on line 56 to the oscillator control circuit as the DC reference signal input to the oscillator control circuitry.

Although an exemplary embodiment of the invention has been disclosed herein for purposes of illustration, it should be understood that various changes, modifications, and substitutions may be incorporated in such embodiment without departing from the spirit of the invention as defined by the claims which follow:

What is claimed is:

1. An amplitude regulated oscillator comprising:

an oscillator circuit operable to produce synchronous first and second oscillation signals substantially in phase quadrature, said oscillation circuit including means for varying the frequency of said oscillation signals over a predetermined range;

reference source means providing a DC voltage reference signal of predetermined amplitude;

means connected to said oscillator circuit and reference source means and operable cyclically in response to one oscillation signal for producing a correction signal proportional in magnitude and related in polarity to the voltage difference between the peak amplitude of the other oscillation signal and said reference signal amplitude, which difference is obtained for a predetermined fixed time period of each oscillation cycle of said other oscillation signal; and means for producing a composite signal which is the product of said correction signal and said other oscillation signal, and applying said composite signal to said oscillator circuit, so as to regulate the amplitude of said oscillation signals.

2. An apparatus according to claim 1, wherein said fixed time period of said other oscillation signal is initiated at a predetermined cycle point in each oscillation cycle of said one oscillation signal.

3. An apparatus according to claim 2, wherein said predetermined cycle point is a negative going zero crossing.

4. An apparatus according to claim 1, wherein said correction signal means includes a comparator, which comparator has an output equal to the voltage difference between said reference signal and said other oscillation signal.

5. An apparatus according to claim 4, wherein said correction signal means includes means for sampling said output of said comparator for said fixed time period of each oscillation cycle of said other oscillation signal.

6. An apparatus according to claim 5, wherein said correction signal means further includes an integrator connected to said composite signal product means, which integrator integrates the output of said comparator during said fixed time period.

7. An apparatus according to claim 5, wherein said sampling means includes means for detecting the negative going zero crossings of said one oscillation signal, and further includes switching means, which switching means, in response to said detecting means, applies the output of said comparator to said integrator for said fixed time period during each oscillation cycle of said other oscillation signal.

8. An apparatus according to claim 6, wherein said comparator includes an amplifier, said reference signal and said other oscillation signal being connected to said amplifier such that the algebraic difference between said reference signal and said other oscillation signal is amplified, the output of said amplifier being connected to said switching means.

9. An apparatus according to claim 7, wherein said sampling means includes a multivibrator, said multivibrator determining said fixed time period.

* * * * *